United States Patent [19]

Hayashi

[11] Patent Number: 5,413,820
[45] Date of Patent: May 9, 1995

[54] REACTIVE IONIZED CLUSTER BEAM DEPOSITION METHOD

[75] Inventor: Akira Hayashi, Tokyo, Japan

[73] Assignee: Tokyo Serofan Co., Ltd., Tokyo, Japan

[21] Appl. No.: 98,512

[22] Filed: Jul. 28, 1993

[30] Foreign Application Priority Data

Feb. 26, 1993 [JP] Japan .................................. 5-038906

[51] Int. Cl.$^6$ ............................................. B05D 3/06
[52] U.S. Cl. .................... 427/527; 427/250; 427/251; 427/255.2; 427/255.3; 427/255.5; 427/294; 427/296; 427/523; 427/529; 427/566; 427/567; 427/568; 427/576; 427/578; 427/579; 427/585
[58] Field of Search ............... 427/523, 566, 296, 250, 427/255.3, 255.2, 527, 529, 567, 568, 576, 578, 579, 585, 294, 251, 255.5

[56] References Cited

FOREIGN PATENT DOCUMENTS

| | | |
|---|---|---|
| 0141417 | 5/1985 | European Pat. Off. . |
| 0263880 | 4/1988 | European Pat. Off. . |
| 3634598 | 5/1988 | Germany . |
| 4218671 | 12/1992 | Germany . |
| 51-101735 | of 1976 | Japan . |

OTHER PUBLICATIONS

Article: *Ionized Cluster Beam Deposition & Epitaxy* by Toshinori Takagi, Published in *Physics of Thin Films*, vol. 13, 1987 Copyright By Academic Press, Inc. (No month available).

Primary Examiner—Bernard Pianalto
Attorney, Agent, or Firm—Rosen, Dainow & Jacobs

[57] ABSTRACT

A reactive ionized cluster beam deposition method according to this invention is embodied by utilizing two vacuum subregions partitioned by a partition wall formed with an opening. A closed heating crucible and an ionization accelerating unit are disposed in one vacuum subregion partitioned by the partition wall. A substrate is also disposed in the other vacuum subregion, and at the same time a reactive gas is introduced thereinto. Degrees of vacuums in the two vacuum subregions partitioned by the partition wall are equal to or different from each other. Particularly, a gas concentration in the latter vacuum subregion is enhanced. Then, the ionized cluster beams formed in the former vacuum subregion are introduced into the latter vacuum subregion via the opening of the partition wall and react to the reactive gas within the latter vacuum subregion. The ionized cluster beams reacting to the reactive gas impinge on the substrate, thereby forming the deposited film on the substrate surface.

13 Claims, 3 Drawing Sheets

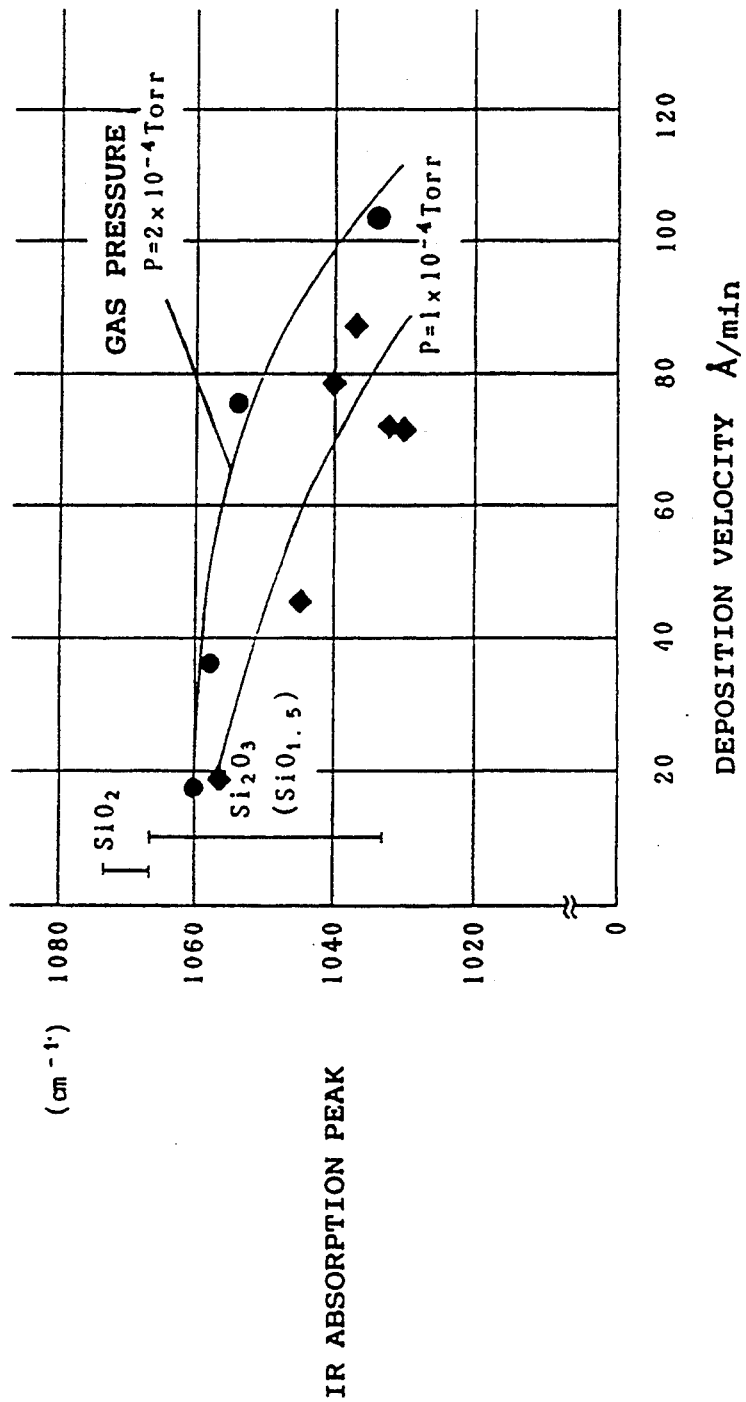

REACTIVE IONIZED CLUSTER BEAM DEPOSITION METHOD

BACKGROUND OF THE INVENTION

The present invention relates generally to a reactive ionized cluster beam deposition method and an apparatus thereof, and more particularly, to a method of and an apparatus for deposition-forming a high quality thin film on the surface of, e.g., a plastic film or the like serving as a substrate.

A technique of deposition-forming a thin film of a metal on a surface of, e.g., a plastic film, etc. is disclosed in, e.g., Japanese Patent Laid-Open Publication No. 52-10869. The conventional thin film forming method disclosed in this Patent Laid-Open Publication basically involves the following steps. A deposition substance is vaporized in a closed type crucible. The vaporized deposition substances are injected from injection nozzles into a vacuum region whose pressure is equal to or less than at least 1/100 of a vapor pressure in the crucible as well as being equal to or smaller than approximately $10^{-2}$ Torr. At the same time, the injected deposition substance bombards the surface of the substrate. The injection speed during the injection is changed, thus controlling a hyperfine structure during the formation of the thin film.

Further, for obtaining a ceramic thin film of a metal oxide or a metal nitride, there exists a reactive ionized cluster beam deposition method requiring an introduction of a reactive gas in addition to the above-mentioned ionized cluster beam method. By the way, according to the ordinary reactive ionized cluster beam (R-ICB) method, the degree of vacuum within the vacuum region is on the order of $2 \times 10^{-4} \sim 5 \times 10^{-4}$ Torr. Reaction is induced by supplying sufficient reactive gas in the vicinity of the injection nozzles in the crucible to maintain this degree of vacuum.

According to the conventional reactive ionized cluster beam deposition method, however, an advancement of 10~100 cm is required for causing a collision and reaction between the deposition substance and the reactive gas atoms under a degree of vacuum of $\times 10^{-4}$. This is based on the following formula obtained approximately from a mean free path theory when the distance from the vaporizing source to the substrate is set to, e.g., about 50 cm.

$$\lambda \approx 10^{-2}/Pr$$

where $\lambda$ is the mean free path (cm), and $Pr$ is the pressure (Torr). The complete reaction is therefore hard to obtain in the setting described above.

Then, if the reactive gas concentration is enhanced to obtain such a degree of vacuum on the order of $\times 10^{-3}$ Torr that the collision advancing distance needed for a sufficient advancement of reaction is 10 cm or less, a glow discharge is produced this time due to the reactive gas in an electron emitter for ionization. This results in a decay of clusters (vaporized atoms or molecules when a deposition substance is vaporized turns into a massive body like a cluster of grapes) due to plasma. The characteristics inherent in the ionized cluster beams are lost, and, at the same time, there arises a problem in terms of degradation of the heating crucible and electrodes derived from the reaction with the reactive gas.

As described above, the conventional reactive ionized cluster beam deposition method presents the following drawbacks. If the necessary gas concentration in the reactive portion is maintained, i.e., if the reactive gas concentration is maintained enough to permit a sufficient advancement of the reaction of the deposition substance with the reaction gas, the heating crucible, the ionizing unit and an acceleration electrode are corroded by the reactive gas. Also, decay of the clusters is caused by the plasma in the electron emitter due to the reactive gas.

Accordingly, it is a primary object of the present invention, which has been devised to obviate the problems peculiar to the prior art, to provide a reactive ionized cluster beam deposition method and an apparatus for forming a deposited film exhibiting an excellent property on the surface of a substrate by the same method.

It is another object of the present invention to prevent a caused-by-reactive-gas degradation of the acceleration electrode when forming a deposited film on the substrate surface by the reactive ionized cluster beam deposition method.

It is still another object of the present invention to prevent a decay of clusters due to the plasma in an electron emitter when forming a deposited film on the substrate surface by the reactive ionized cluster beam deposition method and to maintain a necessary gas concentration in a reactive portion.

It is a further object of the present invention to form a deposited film having a good crystallinity on the substrate surface by the reactive ionized cluster beam deposition method.

It is a still further object of the present invention to provide a film formed with a deposited film which is excellent in terms of a water vaporproof performance and an oxygen barrier performance by the reactive ionized cluster beam deposition method.

SUMMARY OF THE INVENTION

According to one aspect of the present invention, there is provided a method of forming a deposited film on the surface of a substrate by causing reaction of metal vaporized clusters to a reactive gas, comprising the steps of: (a) heat-vaporizing a deposition substance in a closed heating crucible; (b) injecting a vapor thereof into a first vacuum subregion of a vacuum region; (c) ionizing atom clusters of the vapor by means of an electron emitter immediately after the injection and transforming the ionized clusters into ionized cluster beams by giving an acceleration energy to the clusters at an acceleration voltage; (d) introducing the ionized cluster beam into a second vacuum subregion of the vacuum region through an opening formed in a wall which separates the vacuum region into the first vacuum subregion where the closed heating crucible and an ionization accelerating unit are located and the second vacuum subregion where a deposited film forming portion is located; (e) introducing a reactive gas into the second vacuum subregion; and (f) causing reaction of the ionized cluster beams with the reactive gas in the second vacuum subregion, and impinging the ionized cluster beams on the substrate of the deposited film forming portion.

Herein, the closed heating crucible is equipped with multiple injection nozzles, and heat-vaporized deposition substances are injected from the injection nozzles.

Further, the heat-vaporized deposition substances are injected out of the closed heating crucible into the vacuum region to satisfy $P_0/P >$ about $10^4 \sim 10^5$ (P is the pressure outside the closed heating crucible) where $P_0$ is the vapor pressure when heat-vaporizing the deposition substance within the heating crucible.

In this case, the vapor pressure $P_0$ of the deposition substance within the closed heating crucible is preferably $1 \sim 10$ Torr.

Furthermore, a degree of vacuum in the second vacuum subregion is equal to or less than a degree of vacuum in the first vacuum subregion in the vacuum region partitioned by the partition wall.

The first vacuum subregion is set preferably at a degree of vacuum (P) on the order of approximately $\times 10^{-4} \sim 10^{-7}$ Torr, and the second vacuum subregion is set preferably at a degree of vacuum on the order of approximately $\times 10^{-2} \sim 10^{-4}$ Torr with the introduction of the reactive gas.

The deposition substance involves the use of a metal such as indium, aluminum, titanium, etc. and an intermediate compound such as silicon monoxide, etc.

The closed heating crucible is made preferably of a resistance heating material which involves the use of tantalum, tungsten or graphite.

The reactive gas introduced into the second vacuum subregion is oxygen or nitrogen.

Then, the substrate serving as the deposited film forming portion is preferably a plastic film. In this case, further preferably, the plastic film is biaxially oriented. The plastic film can be continuously moved by means of a running or film transfer unit, and the deposited film can be formed on the surface of the plastic film during its movement.

According to another aspect of the present invention, there is provided a reactive ionized cluster beam deposition apparatus for directly embodying the above-mentioned deposition method, fundamentally comprising: a deposition substance is heat-vaporized within a closed heating crucible, disposed in a vacuum region, the vaporized deposition substance is injected the closed heating crucible and then ionized by an electron emitter, an acceleration energy is given to the vaporized deposition substance at an acceleration voltage, and the deposition substance is reacted with the reactive gas.

In the reactive ionized cluster beam deposition apparatus having the fundamental construction given above, the vacuum region is partitioned by a partition wall into a first vacuum subregion where the closed heating crucible and an ionization accelerating unit are located and a second vacuum subregion where the reactive gas is introduced and a deposited film forming portion is located. The partition wall is formed with an opening through which the deposition substance accelerated at the acceleration voltage enters the second vacuum subregion from the first vacuum subregion.

Based on this construction, an installing location of the partition wall is determined preferably in consideration of a pressure per unit area of the cluster beams in the opening. In short, this is intended to prevent an inflow of the reactive gas from the second vacuum subregion into the first vacuum subregion via the opening.

Further, the degree of vacuum in the second vacuum subregion is equal to or less than a degree of vacuum in the first vacuum subregion with an introduction of the reactive gas.

To sum up, this is intended to induce complete reaction of the deposition substance with the reactive gas at a short advancing distance by enhancing the gas concentration within the second vacuum subregion into which the reactive gas is introduced.

The closed heating crucible is equipped with multiple injection nozzles, and heat-vaporized deposition substances are injected from the injection nozzles.

The heat-vaporized deposition substances are injected out of the closed heating crucible into the vacuum region to satisfy $P_0/P >$ about $10^4 \sim 10^5$ (P is the pressure outside the closed heating crucible) where $P_0$ is the vapor pressure when heat-vaporizing the deposition substance within the heating crucible.

In this case, the vapor pressure $P_0$ of the deposition substance within the closed heating crucible is preferably $1 \sim 10$ Torr.

On the other hand, the first vacuum subregion is set preferably at a degree of vacuum on the order of approximately $\times 10^{-4} \sim 10^{-7}$ Torr, and the second vacuum subregion is set preferably at a degree of vacuum on the order of approximately $\times 10^{-2} - 10^{-4}$ Torr with the introduction of the reactive gas.

Then, the deposition substance involves the use of a metal such as indium, aluminum, titanium, etc. and an intermediate compound such as silicon monoxide, etc.

Besides, the closed heating crucible is made preferably of a resistance heating material which involves the use of tantalum, tungsten or graphite.

Furthermore, the reactive gas introduced into the second vacuum subregion is oxygen or nitrogen.

Then, the substrate serving as the deposited film forming portion is preferably a plastic film. In this case, further preferably, the plastic film is biaxially oriented. Then, this plastic film can be continuously moved by means of the film transfer unit, and the deposited film can be formed on the surface of the plastic film during its movement.

According to the reactive ionized cluster beam deposition method and the apparatus of the present invention, the deposition substance is heated in the closed heating crucible disposed in the first vacuum subregion. Vapors of the deposition substance are injected from the injection nozzles. At this time, atom clusters are formed with an adiabatic expansion. The clusters are ionized by the electron emitter. Simultaneously, an acceleration energy, viz., a kinetic energy produced by an acceleration voltage is added thereto. The clusters enter the second vacuum subregion via the opening of the partition wall. The clusters react with the reactive gas in this second vacuum subregion and bombard the surface of the substrate defined as a deposited film forming portion.

The clusters impinging on the substrate surface are individually scattered, and there appears the same effect as causing biaxial orientation of a plastic film. Formed on the substrate surface is a thin film equivalent to the deposited film exhibiting a good crystallinity. In this case, the reactive gas introduced into the second vacuum subregion is not allowed to enter the first vacuum subregion via the opening because of the ionization accelerating clusters being jetted upward from the opening of the partition wall when supplied with the kinetic energy from the first vacuum subregion. There is no decay of the clusters due to the glow discharge caused in the ionizing unit. The electrode is not also degraded.

BRIEF DESCRIPTION OF THE DRAWINGS

FIG. 3 is a characteristic diagram showing a measurement example of a test for oxidation characteristics and deposition velocities when an oxygen gas concentration is on the order of $1 \times 10^{-4}$ Torr and $2 \times 10^{-4}$ Torr.

DESCRIPTION OF THE PREFERRED EMBODIMENT

One example of a reactive ionized cluster beam deposition method and an apparatus thereof according to this invention will hereinafter be described in greater detail with reference to the drawings.

Figure 1:
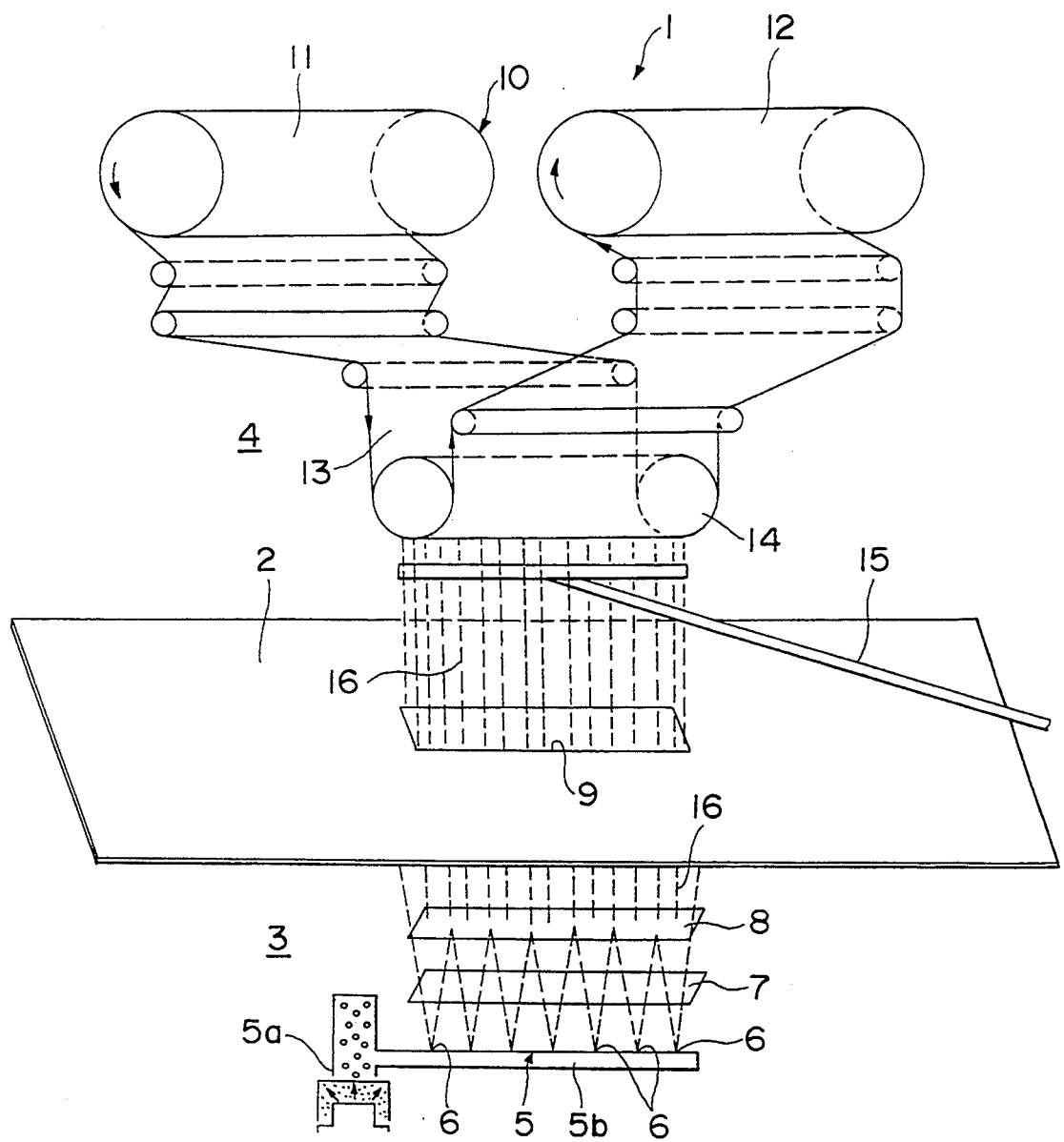
FIG. 1 is an explanatory view schematically illustrating one example of construction of a reactive ionized cluster beam deposition apparatus according to this invention.

FIG. 1 schematically illustrates a reactive ionized cluster beam deposition apparatus 1 in one example according to the present invention. This deposition apparatus 1 takes a double chamber structure wherein a vacuum region is partitioned by a partition wall 2 into a first vacuum subregion 3 formed downward and a second vacuum subregion 4 formed upward. A closed type heating crucible 5 for heat-vaporizing an evaporative substance is installed in the first vacuum subregion 3.

The closed heating crucible 5 is sectioned into two units, i.e., an evaporative material supplying unit 5a and a vaporizing unit 5b. The crucible 5 effects resistance-heating which involves the use of materials such as tantalum, tungsten or graphite. The evaporative material supplying unit 5a, which further employs an electron gun jointly as a heating source, controls an evaporation supply quantity of the evaporative material. The vaporizing unit 5b is equipped with multiple injection nozzles 6 arranged in one line. An electron emitter 7 is provided above these injection nozzles 6. An accelerating electrode 8 is further provided above the electron emitter 7.

The partition wall 2 is also formed with an opening 9 through which clusters pass. A film transfer unit 10 for a plastic film serving as a substrate is provided in the second vacuum subregion 4 upwardly of the partition wall 2. This plastic film transfer unit 10 includes two rolls 11 and 12. The roll 11 is a feed roll wound with a plastic film 13 defined as the substrate. The roll 12 is a take-up roll for taking up the plastic film 13 fed out of the feed roll 11.

A positioning roll 14 for positioning the plastic film 13 at a deposition unit above the opening 9 is installed upwardly of the opening 9 formed in the partition wall 2. The plastic film 13 fed out of the feed rolls 11 is wound on the take-up roll 12 through the positioning roll 14. A reactive gas introducing pipe 15 is led in the second vacuum subregion 4. An outlet of this introducing pipe 15 is located between the opening 9 of the partition wall 2 and the positioning roll 14 defined as the deposition unit.

The first vacuum subregion 3 is kept under a degree of vacuum (P) on the order of $\times 10^{-4} \sim 10^{-7}$ Torr. The second vacuum subregion 4 is also kept under a degree of vacuum on the order of $\times 10^{-2} \sim 10^{-4}$ Torr with an introduction of the reactive gas. The degree of vacuum in the second vacuum subregion 4 is thus set smaller than in the first vacuum subregion 3. Namely, the second vacuum subregion 4 is set at a higher pressure than the first vacuum subregion 3. This tends to enhance the gas concentration within the second vacuum subregion 4 into which the reactive gas is introduced so as to induce complete reaction of the deposition substance with the reactive gas in a short length within this vacuum subregion 4.

According to the thus constructed reactive ionized cluster beam deposition apparatus 1, the deposition substance is heated in the closed heating crucible 5 so that the vapor pressure ($P_0$) thereof becomes $1 \sim 10$ Torr. At this time, it is required that a relationship between the vapor pressure in the closed heating crucible and the pressure of the first vacuum subregion 3 in the outside thereof be selected to satisfy this relationship: $P_0/P >$ about $10^4 \sim 10^5$.

Then, a vapor of the deposition substance is injected from each injection nozzle 6 of the closed heating crucible 5 into the first vacuum subregion 3 having a degree of vacuum on the order of $\times 10^{-4} \sim 10^{-5}$ Torr. The vapors injected from the injection nozzles 6 form atom clusters with an adiabatic expansion. The atom clusters are ionized by the electron emitter 7 and thereafter accelerated by the accelerating electrode 8. The ionized clusters produce ionized cluster beams 16 therein.

The ionized cluster beams 16 pass through the opening 9 of the partition wall 2 and enter the second vacuum subregion 4. The cluster beams react with the reactive gas therein and bombard the surface of the plastic film 13 passing above the opening 9 with the aid of the positioning roll 14. With this bombardment, the respective atoms of the ionized clusters are scattered. There appears the same effect as causing biaxial orientation of a plastic film. A hyperfine structure thereof can be remarkably improved.

By the way, the following question arises with respect to the reactive ionized cluster beam deposition apparatus 1 having the above-mentioned construction. Even if the vacuum region is partitioned by the partition walls 2 into as many subregions as possible, the opening 9 serving as a beam passageway is formed in the partition wall 2. Consequently, the reactive gas easily flows into the first vacuum subregion 4 exhibiting a higher degree of vacuum. It seems that the respective degrees of vacuums in the two vacuum subregions 3, 4 can not be maintained. Concerning this point, however, there is no problem if the pressure of the cluster beams 16 in the opening 9 of the partition wall 2 is equal to or greater than the pressure of the reactive gas which is to enter the first vacuum subregion.

This point will be explained in greater detail. A total beam energy immediately after the injection is, it can be judged, substantially equal to a total beam energy in the opening 9. It therefore follows that a pressure of the cluster beam 16 per unit area in the opening 9 of the partition wall 2 is in reverse proportion to a ratio of the an injection nozzle area to a beam diffused area in the opening 9.

Now, a diameter of each injection nozzle 6 in the closed heating crucible 5 is set to 2 mm. A vapor pressure of the deposition substance is set at $1 \sim 10$ Torr, and an injection angle of set at $\pm 10$ degrees. In this case, the beam diffused area apart 20 cm from the injection nozzle is approximately 1000 times as large as the injection nozzle area. It is sufficiently possible to keep the pressure per unit area in the injecting direction on the order of $10^{-3}$ Torr. Besides, a kinetic energy given by an ionization accelerating voltage is added thereto, and hence there is absolutely no problem.

As obvious from this, the reactive gas does not flow into the first vacuum subregion 3 via the opening 9 from the second vacuum subregion 4. Accordingly, the closed heating crucible 5 and the accelerating electrode 8 are not degraded. If the distance from the injection nozzle 6 to the opening 9 thus increases, however, the injection pressure of the beam 15 abruptly decreases enough to reduce the effect of preventing the reactive gas from entering the first vacuum subregion 3. It is therefore necessary to pay considerable attention to a location of the partition wall 2.

Next, an embodiment of the reactive ionized cluster beam deposition method of this invention will be explained.

Figure 2:
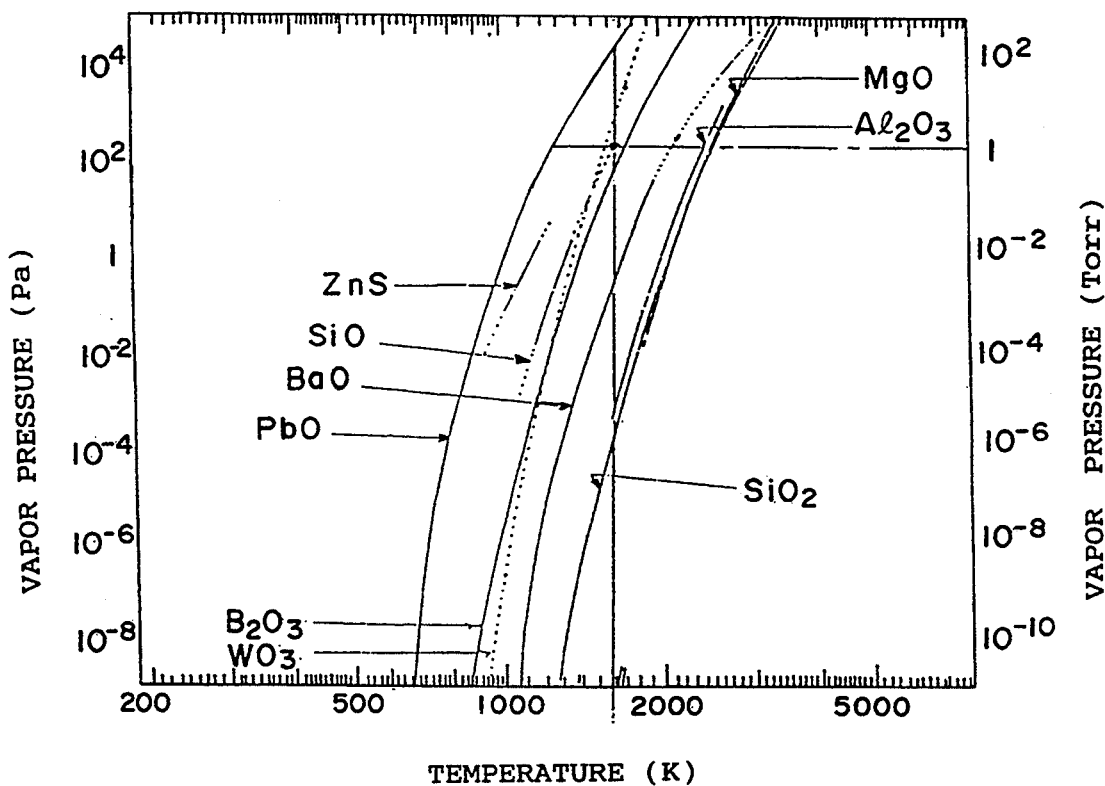
FIG. 2 is a characteristic diagram showing a relationship of temperature versus vapor pressure in an injection unit with respect to a plurality of deposition substances when heat-vaporizing the deposition substance in a crucible.

Silicon monoxide (SiO) serving as a deposition substance is put into the tantalum heater crucible 5 disposed at the lowermost portion of the first vacuum subregion 3 in the apparatus illustrated in FIG. 1. A temperature is kept at 1600~1700 K (see FIG. 2 in the form of a graphic chart showing a relationship of temperature versus vapor pressure) in the injection unit so that a vapor pressure of SiO becomes 1~10 Torr. The evaporative material supplying unit 5a of the closed heating crucible 5 continuously supplies the SiO vapor corresponding to an injection quantity by electron beam heating.

The vaporizing unit 5b of the closed heating crucible 5 is formed with seven injection nozzles 6 each having an aperture diameter of 2 mm and arranged at intervals of 3 cm in the horizontal direction. Each injection nozzle 6 injects the SiO vapor toward the first vacuum subregion 3 in which the degree of vacuum is kept at $5\times10^{-4}$~$10^{-5}$ Torr. Atom clusters of the SiO vapor injected from each injection nozzle 6 are, as illustrated in FIG. 1, ionized by the electron emitter 7 (ionization voltage: 0.5 KV, ionization current: 200 mA) immediately after the injection. Just when a distribution of SiO vapor concentrations becomes uniform in the horizontal direction, an acceleration energy is given at an acceleration voltage of 5 KV toward the substrate. The ionized atom clusters of the SiO vapor are thereby made to pass through the opening 9 (18 cm×7 cm) of the partition wall 2 installed 20 cm upward from the injection nozzle 6 and introduced into the second vacuum subregion 4.

The second vacuum subregion 4 formed upwardly of the partition wall 2 is supplied with oxygen gas ($O_2$) as the reactive gas. The exhaust quantity is controlled so that the degree of vacuum falls within a range of $5\times10^{-3}$~$5\times10^{-4}$ Torr. The gas concentration is set so that a bombardment distance of 10 cm or less required for a sufficient advancement of reaction of the SiO vapor with the reactive gas is to be expected. The deposition substrate involves the use of a biaxially orientated polyester film having a thickness of 20µ and a width of 20 cm and run by the plastic film running unit 10 at a speed of 20 m/min.

The vaporization continues under the conditions described above till the entire quantity of SiO existing in the crucible is consumed up. The degrees of vacuums in the first and second subregions 3, 4 partitioned by the partition wall can be easily continuously kept within the set range mentioned above. Further, stable deposition can be obtained without causing a glow discharge.

A deposited film deposited on the deposition substrate polyester biaxially oriented film has such characteristics that the film is colorless and transparent in terms of its appearance, its thickness is approximately 400 Å as a mean value when measured at several points, and an IR absorption peak (see FIG. 3) is about 1065 $cm^{-1}$. It is judged that a substantially complete $SiO_2$ film is deposited thereon. Note that FIG. 3 shows, for reference, a measurement example of a test for a deposition velocity and an oxidation characteristic when an oxygen gas concentration is $1\times10^{-4}$ Torr and $2\times10^{-4}$ Torr.

This embodiment is intended for industrial production, and deposition is effected at a speed that is several hundred times that of the test condition shown in FIG. 3. Nevertheless, however, it is judged that complete and stable oxidative reaction is obtained. The result is that the availability of the reactive gas concentration increased this effect owing to the double-compartment separation has been demonstrated.

A food packaging film may be given as an application of the plastic film having its surface formed with the deposited film by this reactive ionized cluster beam deposition method. Namely, the plastic film formed with the deposited film by the deposition method according to this invention has an extremely good hyperfine structure because of its deposited film exhibiting the same effect as causing the biaxial orientation of the plastic film as explained earlier. This plastic film is therefore excellent in terms of a water vaporproof performance and an oxygen barrier performance as well.

Incidentally, if a deposited film of indium oxide is formed on the plastic film by the method of this invention, a transparent conductive film exhibiting a good conductivity can be provided at low costs.

As discussed above, according to the reactive ionized cluster beam deposition method and apparatus thereof of this invention, the deposited film deposited on the upper surface of the substrate has a really excellent property. As a result, it is possible to provide film formed with the deposited film that is superlative in terms of the water vaporproof performance and the oxygen barrier performance as well. When this film is employed for packaging foods, it also serves remarkably well in preserving them.

Further, when the deposited film of indium oxide is formed on the plastic film by the deposition method of the present invention, a transparent conductive film exhibiting good conductivity can be provided. The application field of this invention is very broad.

According to the present invention, it is feasible to provide a film formed with the deposited film having excellent water vaporproof and oxygen barrier performance. This film can therefore be employed for packaging foods. A transparent conductive film manifesting the good conductivity can be also provided and therefore used as part of a film-like solar cell.

What is claimed is:

1. A method of forming a deposited film on a substrate, comprising the steps of:
   (a) heat-vaporizing a deposition substance in a closed heating crucible;
   (b) injecting a vapor thereof into a first vacuum subregion of a vacuum region;
   (c) ionizing atom clusters of said vapor by means of an electron emitter immediately after the injection, and transforming said ionized clusters into ionized cluster beams by giving said clusters an acceleration energy at an acceleration voltage;
   (d) introducing the ionized cluster beam into a second vacuum subregion of said vacuum region through an opening formed in a wall which separates said vacuum region into said first vacuum subregion where said closed heating crucible and an ionization accelerating unit are located and said second vacuum subregion where a deposited film forming portion is located;

(e) introducing a reactive gas into said second vacuum subregion; and (f) causing reaction of said ionized cluster beams with said reactive gas in said second vacuum subregion, and impinging said ionized cluster beam on said substrate at said deposited film forming portion.

2. The reactive ionized cluster beam deposition method as set forth in claim 1, wherein said closed heating crucible is equipped with multiple injection nozzles, and heat-vaporized deposition substances are injected from said injection nozzles.

3. The reactive ionized cluster beam deposition method as set forth in claim 1, wherein said heat-vaporized deposition substances are injected out of said closed heating crucible into said vacuum region to satisfy $P_0/P >$ about $10^4 \sim 10^5$ (P is the pressure outside said closed heating crucible) where $P_0$ is the vapor pressure when heat-vaporizing said deposition substance within said heating crucible.

4. The reactive ionized cluster beam deposition method as set forth in claim 3, wherein the vapor pressure $P_0$ of the deposition substance within said closed heating crucible is $1 \sim 10$ Torr.

5. The reactive ionized cluster beam deposition method as set forth in claim 1, wherein a degree of vacuum in said second vacuum subregion is equal to or less than a degree of vacuum in said first vacuum subregion in said vacuum region partitioned by said partition wall.

6. The reactive ionized cluster beam deposition method as set forth in claim 5, wherein said first vacuum subregion is set at a degree of vacuum on the order of approximately $\times 10^{-4} \sim 10^{-7}$ Torr, and said second vacuum subregion is set at a degree of vacuum on the order of approximately $\times 10^{-2} \sim 10^{-4}$ Torr with the introduction of said reactive gas.

7. The reactive ionized cluster beam deposition method as set forth in claim 1, wherein said deposition substance is a metal such as indium, aluminum, titanium, and an intermediate compound such as silicon monoxide.

8. The reactive ionized cluster beam deposition method as set forth in claim 1, wherein said closed heating crucible is made of a resistance heating material which involves the use of tantalum, tungsten or graphite.

9. The reactive ionized cluster beam deposition method as set forth in claim 1, wherein said reactive gas introduced into said second vacuum subregion is oxygen or nitrogen.

10. The reactive ionized cluster beam deposition method as set forth in claim 1, wherein said substrate serving as said deposited film forming portion is a plastic film.

11. The reactive ionized cluster beam deposition method as set forth in claim 10, wherein said plastic film is biaxially oriented.

12. The reactive ionized cluster beam deposition method as set forth in claim 10, wherein said plastic film is continuously moved by means of a film transfer unit, and said deposited film is formed on the surface of said plastic film during its movement.

13. The reactive ionized cluster beam deposition method as set forth in claim 1, wherein a vaporizing unit of said closed heating crucible is formed with seven injection nozzles each having an aperture diameter of 2 mm and arranged at intervals of 3 cm in the horizontal direction, said each injection nozzle injects SiO vapor toward said first vacuum subregion kept at a degree of vacuum on the order of $5 \times 10^{-4} \sim 10^{-5}$ Torr, atom clusters of the SiO vapor injected from said each injection nozzle are ionized by an electron emitter (ionization voltage: 0.5 KV, ionization current: 200 mA) immediately after the injection, an acceleration energy is given at an acceleration voltage of 5 KV toward said substrate just when a distribution of SiO vapor concentration becomes uniform in the horizontal direction, said ionized atom clusters of the SiO vapor are made to pass through said opening (18 cm $\times$ 7 cm) of said partition wall installed 20 cm upward from said injection nozzle and thereby introduced into said second vacuum subregion, an oxygen gas ($O_2$) as said reactive gas is supplied to said second vacuum subregion formed upwardly of the partition wall 2, an exhaust quantity is controlled so that the degree of vacuum falls within a range of $5 \times 10^{-3} \sim 5 \times 10^{-4}$ Torr, and the gas concentration is set so that a bombardment distance of 10 cm or less required for a sufficient advancement of reaction of said SiO vapor with said reactive gas is to be expected.

* * * * *